United States Patent [19]

Jansson

[11] Patent Number: 4,988,898
[45] Date of Patent: Jan. 29, 1991

[54] HIGH SPEED ECL/CML TO TTL TRANSLATOR CIRCUIT

[75] Inventor: Lars G. Jansson, Long Island, Me.

[73] Assignee: National Semiconductor Corporation, Santa Clara, Calif.

[21] Appl. No.: 352,169

[22] Filed: May 15, 1989

[51] Int. Cl.⁵ ............... H03K 19/013; H03K 19/092; H03K 19/086; H03K 19/088

[52] U.S. Cl. .................... 307/475; 307/455; 307/456; 307/443; 323/315

[58] Field of Search ............ 307/455, 456, 457, 475, 307/443, 355, 358, 360, 363, 270, 264, 247.1, 544, 546, 547, 549, 551, 553, 558, 559, 560, 567; 323/312, 315, 316, 317

[56] References Cited

U.S. PATENT DOCUMENTS

| | | | |
|---|---|---|---|
| 3,766,406 | 10/1973 | Bryant et al. | 307/475 |
| 4,456,838 | 6/1984 | Taguchi et al. | 307/475 X |
| 4,527,078 | 7/1985 | Smith | 307/456 X |
| 4,536,664 | 8/1985 | Martin | 307/475 |
| 4,578,602 | 3/1986 | West et al. | 307/475 |
| 4,609,837 | 9/1986 | Yagyuu et al. | 307/475 X |
| 4,629,913 | 12/1986 | Lechner | 307/475 |
| 4,644,194 | 2/1987 | Birrittella et al. | 307/455 X |
| 4,684,831 | 8/1987 | Kruest | 307/455 X |
| 4,871,929 | 10/1989 | Hollstein et al. | 307/475 X |

Primary Examiner—Stanley D. Miller
Assistant Examiner—David R. Bertelson
Attorney, Agent, or Firm—Lee Patch; Daniel H. Kane

[57] ABSTRACT

An ECL/CML to TTL translator circuit couples the output of an ECL/CML gate to the input of a TTL gate. The ECL/CML gate operates with reference to a first power rail higher reference voltage level with transistor elements operating in the non-saturation operating region. The TTL gate operates with reference to a second power rail lower reference voltage level with transistor elements operating in the saturation operating region. The translator circuit includes a reference voltage level shifting constant current non-switching current mirror circuit coupled to the output of the ECL/CML gate. The current mirror circuit shifts the reference voltage level of the ECL/CML gate output from the higher reference voltage level to the lower reference voltage level and delivers a reference voltage level shifted output signal. An operating region translating emitter follower output buffer circuit is coupled to receive the voltage level shifted output signal and drive the input of the TTL gate in the saturation region. The circuit functions of reference voltage level shifting and of operating region translating are thereby separately performed by separate components. The TTL gate input is a phase splitter transistor element. A resistor pulldown discharges the phase splitter transistor element. Base drive to the phase splitter transistor element is limited by a base drive limiting anti-saturation clamp. More generally, an overdrive and anti-saturation clamp circuit provides high speed switching of the phase splitter or other TTL switching transistor element.

24 Claims, 4 Drawing Sheets

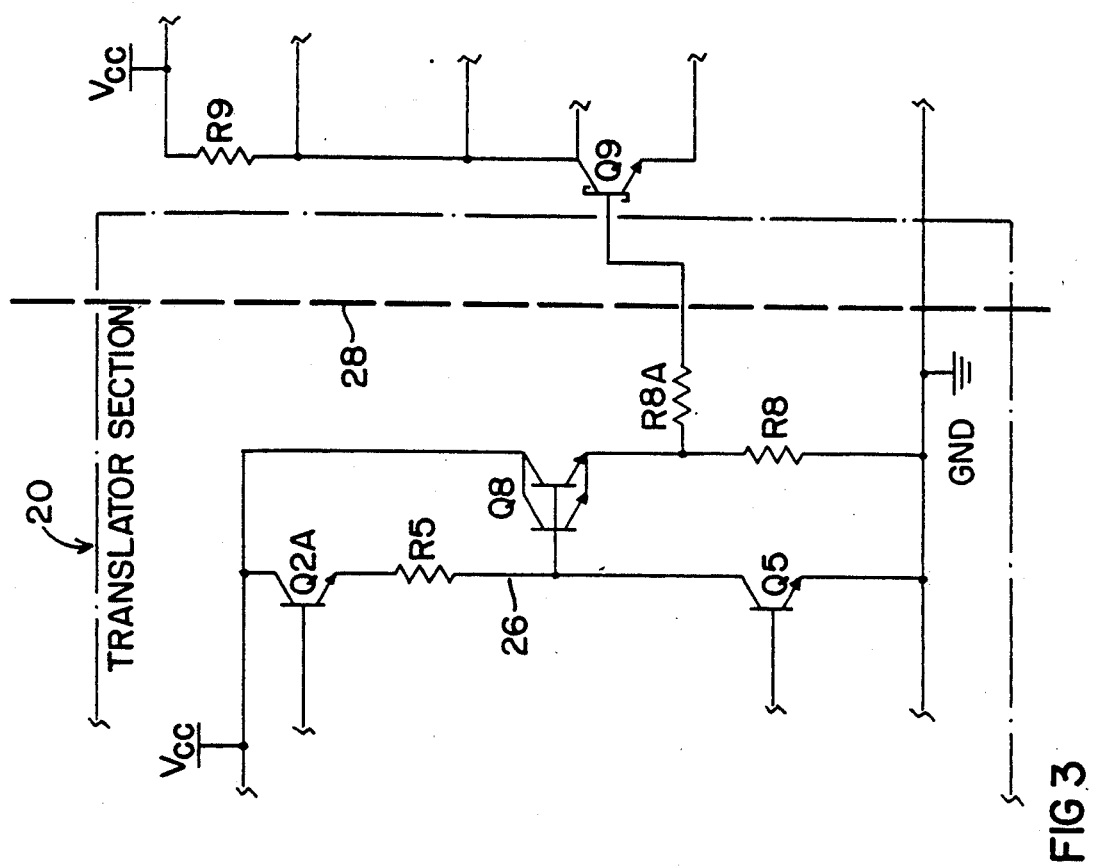
FIG 3
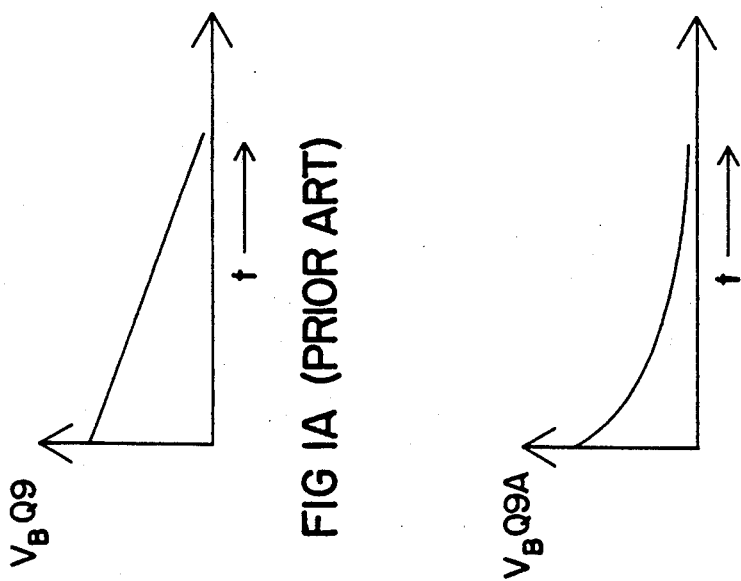
FIG 1A (PRIOR ART)
FIG 2A

HIGH SPEED ECL/CML TO TTL TRANSLATOR CIRCUIT

TECHNICAL FIELD

This invention relates to a new ECL/CML to TTL translator circuit for coupling the output of an emitter coupled logic (ECL) or current mode logic (CML) gate to the input of a transistor transistor logic (TTL) gate. The translator circuit shifts the signal reference voltage level from the ECL or CML reference voltage to the TTL reference voltage, and translates the operating region of the respective transistor elements from the ECL or CML non-saturation operating region to the TTL saturation or threshold saturation operating region. The invention is particularly applicable to integrated circuits in which the ECL/CML gates and TTL gates are coupled between the same power rails, such as $V_{CC}$ and ground potential power rails. More generally, the invention provides a new overdrive and clamp circuit for high speed switching of a TTL phase splitter transistor element or other TTL switching transistor element. The high speed switching overdrive and clamp circuit also provides graduated turn on of the TTL switching transistor element for inhibiting ground bounce, and a counteracting current for cancelling ground undershoot.

BACKGROUND ART

A conventional ECL/CML to TTL translator circuit 10, coupled between an ECL/CML gate 12 and a TTL gate 14 is illustrated in FIG. 1. The ECL gate 12 provides the input to the translator section 10 and the ECL gate voltage levels are referenced to the higher reference voltage level positive power rail $V_{CC}$ (ECL) The translator section 10 in turn provides the input to drive the TTL gate 14. The TTL gate voltage levels are referenced to the lower reference voltage level ground power rail GND (TTL). The ECL gate 12 includes ECL input transistors Q1 and Q2 with emitter nodes tied together to the ECL tail current source transistor element Q3 and tail resistor R3. Current source transistor element Q3 is provided with base drive current by tail current source voltage $V_{CS}$ and sources tail current through tail resistor R3 to a low voltage level $V_{EE}$ which in this example may be ground potential GND. The ECL input transistors Q1 and Q2 provide alternative collector lead resistor current paths through swing resistors R1 and R2. Complementary high and low logic base current levels at the complementary inputs $I_{IN}$ (1) and $I_{IN}$ (0) at the respective base nodes of the input transistors Q1 and Q2 determine which transistor is conducting for conducting tail current generated by current source transistor element Q3 through the respective swing resistor.

The complementary outputs of ECL gate 12 are taken from the respective collector nodes of ECL input transistors Q1 and Q2. The voltage swing between the logic high and low level output signals is established by the magnitude of the tail current generated by current source transistor element Q3 and tail resistor R3, and by the swing resistors R1 and R2 which are generally of equal value. The complementary output signals are delivered through emitter follower output buffer transistor elements Q1A and Q2A respectively.

In the conventional translator circuit 10 of FIG. 1, the emitter follower output transistor elements Q1A and Q2A are coupled in respective branch circuits 15,16 of a current mirror circuit. The current mirror circuit is established by current mirror transistor elements Q4 and Q5 coupled in current mirror configuration with respective collector lead resistors R4 and R5. Transistor element Q4 is a base collector shorted (BCS) transistor. Resistors R4 and R5 are of equal value and resistor R4 establishes the current level in the branch circuit 15 which is mirrored in branch circuit 16.

The current flowing in branch circuit 15 is established by resistor R4 and the voltage drop across resistor R4 which is dependent upon $V_{CC}$. Analysis reveals that resistor R5 in branch circuit 16 shifts the reference voltage level of the output signal on line 16 from $V_{CC}$ to ground potential at the collector node of the second current mirror transistor Q5. This is because the $V_{CC}$ dependency of the voltage drop across resistor R5 is cancelled by the $V_{CC}$ dependency of the current mirrored in branch circuit 16 from branch circuit 15. With the $V_{CC}$ dependencies offsetting and cancelling each other in branch circuit 16, the voltage level at the collector node of current mirror transistor Q5 is set with reference to the TTL ground potential level GND (TTL).

The reference voltage level shifted output signal from the collector node of current mirror transistor Q5 is coupled directly to the base node of inverting stage transistor Q6 which in turn controls the phase splitter transistor element Q9 of the TTL gate 14. While the current mirror transistor element Q5 in current mirror branch circuit 16 operates in the linear or non-saturation operating region characteristic of the emitter coupled logic, the inverting stage transistor element Q6 operates in the non-linear saturation operating region characteristic of the TTL gate transistor elements. The reference voltage level shifted output signal directly drives the first stage transistor element associated with the TTL gate and operating in the non-linear saturation region. The dividing line between components operating in the linear non-saturation operating region characteristic of the emitter coupled logic, and the components operating in the non-linear saturation operating region characteristic of the transistor transistor logic is indicated by dash line 18.

The first stage saturation region transistor element Q6 is coupled to the base of phase splitter transistor element Q9 of the TTL gate 14 through diode D1 and includes collector lead resistors R6 and R16. The collector node of inverting stage saturation region transistor element Q6 is coupled through the boot strap circuit provided by boot strap transistor element Q7 and resistor R7 to the base node of transistor element Q6 and to the reference voltage level shifted collector node of current mirror transistor element Q5. The boot strap current applied through resistor R7 after the base of first stage TTL transistor element Q6 is discharged, assures that current mirror transistor element Q5 remains out of the saturation operating region and in the linear operating region.

A disadvantage of the conventional translator circuit 10 of FIG. 1 is that the current mirror circuit is a switching current mirror circuit. The current mirror transistor elements Q4 and Q5 switch between two different emitter current densities in response to switching between high and low logic levels at the collector node of ECL input transistor Q1 and switching of the emitter current from emitter follower buffer transistor element Q1A. The switching of emitter current densities by current mirror transistor Q4 is mirrored by current mirror transistor Q5. The current mirror current source transistor elements Q4 and Q5 can respond only slowly with delayed switching of the voltage level at the collector node of current mirror transistor element Q5. In this conventional translator circuit the current mirror branch circuits 15 and 16 operate together switching between two different current level states with two different voltage drops across resistors R4 and R5 according to the high or low switching level at the input of ECL input transistor Q1. Because of the slow switching response of current source transistors Q4 and Q5, inherent propagation delays are introduced in the translator section 10.

Furthermore, discharge of the base of the first saturation stage transistor element Q6 takes place directly through the current mirror transistor element Q5. The switching from high to low voltage level at the collector node of current mirror transistor element Q5, and discharge of the base of transistor element Q6 operating in the saturation region, follows a delayed linear ramp function as shown for example in FIG. 1A. Overall, the same level switching node, that is, the collector node of transistor element Q5 where the reference voltage level shift occurs also drives the base of the first stage transistor element Q6 operating in the TTL saturation operating region. The same transistor element component Q5 must perform these simultaneous functions.

Thus, according to the prior art ECL/CML to TTL translator circuit 10 the reference voltage level shift and the operating region translation take place in the same branch circuit 16 of a switching current mirror circuit. The same current mirror current source transistor element Q5 drives both the reference voltage level shift and drains the base of the first TTL saturation operating region transistor element. The result is delayed propagation during switching transitions and in particular high to low transitions at the ECL gate input and TTL gate output. The same component, a current source current mirror transistor element Q5 with the inherently slow switching function as illustrated in FIG. 1A drives both functions of reference voltage level shifting and operating region translation limiting the switching speed of the translator circuit.

The TTL gate 14 is provided by the conventional components including the Darlington pair of pullup transistor elements Q11 and Q12 for sourcing current from the high potential power supply rail $V_{CC}$(TTL) to the output $V_{OUT}$ (TTL). Pulldown transistor element Q13 sinks current from the output $V_{OUT}$ (TTL) to the lower ground potential rail GND (TTL). Resistor R12 and diode D12 provide resistive pulldown discharge for the base of pulldown transistor element Q13. An "A. C. Miller killer" of the type described in U.S. Pat. No. 4,321,490, for active discharge of capacitive feedback Miller current at the base of pulldown transistor element Q13 is provided by active discharge transistor Q14 and associated diode network D9, D10, and D11. Accelerated switching of the output from high to low potential is provided by feedback transistor Q10 with feedback transistor base drive through resistor R10 and diode D6. Speed up diode D5 accelerates turnoff at the base of Darlington transistor Q12 during transition from high to low potential at the output $V_{OUT}$(TTL). Additional bias components associated with the Darlington pullup transistor elements Q11 and Q12 include resistor R11, diode D7 and diode D8.

OBJECTS OF THE INVENTION

It is therefore an object of the present invention to provide a new ECL/CML to TTL translator circuit utilizing a constant current non-switching current mirror circuit to accomplish the reference voltage level shifting and signal propagation from an ECL/CML gate to a TTL gate without the delays interposed by switching current mirror transistor elements.

Another object of the invention is to increase speed of signal propagation from an ECL/CML gate to a TTL gate by separating the functions of reference voltage level shifting and transistor element operating region translating. Reference voltage level shifting from the higher voltage level ECL rail to the lower voltage level TTL rail is to be accomplished by a constant current, non-switching, current mirror circuit. Translating from the linear non-saturation operating region of the ECL transistor elements to the non-linear saturation operating region of the TTL transistor elements is to be accomplished by a separate emitter follower output buffer circuit. The functions are therefore performed by separate components in separate circuit portions.

A further object of the invention is to provide accelerated turn on and turn off of the TTL gate phase splitter transistor element operating in the saturation region or at the threshold of the saturation operating region. This is accomplished in part by the separation of the functions of phase splitter control from the reference voltage level shifting. To this end, the invention uses different circuit components for reference voltage level shifting and for operating region translating as stated.

It is also an object of the invention to provide high speed switching of the TTL phase splitter transistor element using a novel anti-saturation overdrive and clamp circuit for accelerated turn on of the phase splitter transistor element, and for rapid turn off by clamping the operation of the phase splitter transistor element at the threshold of saturation to prevent deep saturation. The overdrive and clamp circuit also increases switching speed and reduces noise by inhibiting ground bounce and cancelling ground undershoot during transition from high to low potential at the TTL output.

An additional object of the invention to eliminate the inverting TTL transistor element stage operating in the saturation region at the input of the TTL gate required in conventional translator circuits.

DISCLOSURE OF THE INVENTION

In order to accomplish these results the invention provides an ECL/CML to TTL translator circuit for coupling the output of an ECL/CML gate to the input of a TTL gate. The ECL/CML gate operates with reference to a first power rail higher reference voltage level, with transistor elements operating in the non-saturation operating region. The TTL gate operates with reference to a second power rail lower reference voltage level, with transistor elements operating in the saturation operating region. According to the invention the circuit functions of reference voltage level shifting and of operating region translating are separated and performed by separate translator circuit portions.

A reference voltage level shifting constant current non-switching current mirror circuit is coupled to the output of the ECL/CML gate. The reference voltage level shifting circuit portion shifts the reference voltage level of the ECL/CML gate output and delivers a reference voltage level shifted output signal. A separate operating region translating emitter follower output buffer circuit is coupled to receive the voltage level shifted output signal. This operating region translating circuit portion drives the input of the TTL gate in the saturation operating region.

In the preferred example embodiment, the reference voltage level shifting constant current circuit includes a first current mirror branch circuit and first current mirror transistor element operatively coupled between the higher reference level and the lower reference voltage level for generating a constant reference current. There is no direct connection between the first current mirror branch circuit and the ECL/CML gate output thereby maintaining the constant reference current during switching of the ECL/CML gate.

The reference voltage level shifting constant current circuit also includes a second current mirror branch circuit and second current mirror transistor element operatively coupled between the ECL/CML gate output and the lower reference voltage level. The second current mirror transistor element is coupled in current mirror configuration with the first current mirror transistor element for mirroring the constant reference current in the second current mirror branch circuit coupled to the output of the ECL/CML gate. The current mirroring also maintains the constant reference current in the second current mirror branch circuit during switching of the ECL/CML gate.

A level shifting resistor element is incorporated in the second current mirror branch circuit for shifting the reference voltage level of the output signal from the ECL/CML gate output. The reference voltage level is shifted from the higher to the lower reference voltage level at the collector node of the second current mirror transistor element. This collector node provides the reference voltage level shifted output from the reference voltage level shifting circuit portion of the translator circuit of the invention.

A feature and advantage of the constant current circuit for reference voltage level shifting according to the invention is that there is no switching of the current mirror transistor elements. The current mirror transistor elements maintain constant emitter current densities thereby avoiding the switching delays introduced into the signal propagation through conventional translator circuits. Furthermore, the function of the current mirror transistor elements in the translator circuit is limited to reference voltage level shifting.

In the reference voltage level shifting circuit portion, the first constant current mirror branch circuit includes a standard reference resistor element having resistance value substantially equal to the reference voltage shifting resistor element in the second constant current mirror branch circuit. A standard reference voltage drop is established across the standard reference resistor element by a diode stack between the resistor element and the lower reference voltage level. A feature and advantage of this arrangement is that the diode stack may also be used to establish the tail current source voltage $V_{CS}$ for driving the tail current source transistor element of the ECL/CML gate. One of the elements of the diode stack may also be a BCS transistor element which also serves as the first current mirror transistor element.

The separate operating region translating circuit is provided by an emitter follower output buffer circuit operating in the non-saturation operating region. The emitter follower output buffer circuit is coupled to receive base drive from the reference voltage level shifted output and to drive the input of the TTL gate in the saturation operating region. The circuit function of operating region translating from the non-saturation operating region to the saturation operating region is thereby separated from the function of reference voltage level shifting and the respective functions are performed by separate circuit components of the translator circuit.

According to the invention the emitter follower output buffer circuit provides resistor pulldown between the TTL gate input and the lower reference voltage level for discharging the first stage transistor element of the TTL gate operating in the saturation region through the resistor pulldown element. In the preferred example embodiment the first TTL gate input stage is provided by the TTL gate phase splitter transistor element. The phase splitter transistor element is coupled to receive base drive directly from the emitter follower output buffer circuit. The resistor pulldown element is coupled between the base node of the phase splitter element and the lower reference voltage level.

A feature and advantage of this arrangement is that the resistor pulldown affords accelerated discharge from the base of the phase splitter transistor element and turn off of the phase splitter transistor element during switching from low to high logic potential level at the TTL gate output. The accelerated discharge by the resistor pulldown contrasts with the delayed ramp switching function of the current mirror current source pulldown provided in the conventional translator circuit. The conventional second current mirror transistor element must perform dual functions of reference voltage level shifting and control of the first stage TTL transistor element operating in the saturation operating region. These delays of the conventional translator circuit are avoided in the present invention.

Another feature and advantage of the operating region translating circuit portion of the translator circuit of the invention is that the emitter follower output buffer circuit provides accelerated turn on of the phase splitter transistor element during transition from high to low potential at the TTL gate output. The emitter follower output buffer transistor element initially provides unlimited base drive or "overdrive" to the base of the phase splitter transistor element for accelerated turn on.

For subsequently limiting base drive to the phase splitter transistor element, the invention according to one alternative embodiment provides a base drive clamp circuit operatively coupled between the collector node of the phase splitter transistor element and the base node of the emitter follower output buffer circuit. When the phase splitter transistor element becomes conducting through the collector to emitter primary current path, the base drive clamp circuit begins conducting and clamps operation of the phase splitter transistor element in the soft saturation operating region. By preventing the phase splitter transistor element from operating in the deep saturation operating region, the phase splitter transistor element is poised for rapid turn off by resistor pulldown upon transition from low to high potential at the TTL gate output.

In an alternative base drive limiting circuit embodiment, a base drive limiting resistor element is coupled between the emitter node of the emitter follower output buffer transistor element and the base node of the phase splitter transistor element. The base drive limiting resistor element provides an alternative to the base drive limiting clamp circuit.

More generally, one feature of the invention is the overdrive and clamp circuit for high speed switching of the phase splitter transistor element or other TTL switching transistor element at the input to the TTL gate. The overdrive and clamp circuit includes the current mirror circuit which provides a reference voltage current source having a reference voltage level providing saturation region forward biasing drive for accelerated turn on of the TTL switching transistor element through the emitter follower transistor element. The emitter follower transistor element provides a buffer coupled to the reference voltage current source for driving the TTL switching transistor element.

The overdrive and clamp circuit also includes the base drive clamp circuit coupled between a collector node of the TTL switching transistor element and a base node of the emitter follower transistor element. The base drive clamp circuit is constructed and arranged for clamping the operation of the TTL switching transistor element in the soft or threshold saturation operating region.

In the preferred example embodiment the TTL switching transistor element is a phase splitter transistor element in a TTL output buffer circuit having a pulldown transistor element for sinking current from the output of the TTL output buffer circuit to low potential upon transition from high to low potential at the output. The phase splitter transistor element is therefore coupled to drive the pulldown transistor element.

According to the preferred example the base drive clamp circuit is provided by a resistor element and a $V_{be}$ diode junction coupled in series. A feature of this base drive clamp arrangement is that the paired resistor and diode junction provide temperature compensation for the base drive across the clamp over a range of temperatures. Alternatively the base drive clamp may be provided by a Schottky diode junction element and a $V_{be}$ junction diode element coupled in series.

Upon transition from a low to high potential at the emitter follower and base node of the phase splitter transistor element, the overdrive provides rapid turn on of the phase splitter transistor element. As the potential at the collector node falls, the base drive clamp begins conducting current into the collector node of the phase splitter transistor element when the forward bias across the base to collector junction of the phase splitter transistor element reaches the saturation threshold operating region. The base drive clamp circuit therefore holds the operation of the phase splitter transistor element in soft saturation for rapid turn off upon a transition from high to low potential at the emitter follower and base node of the phase splitter transistor element.

A feature and advantage of the base drive clamp circuit coupled between the collector node of the TTL phase splitter transistor element or other input TTL switching transistor element and a base node of the emitter follower transistor element is that it inhibits ground bounce by providing phased turn on of the phase splitter transistor element or other switching TTL transistor element. Initially upon turn on of the phase splitter transistor element, the collector path current rises while the collector node potential falls. Initially the collector current level is provided by the collector path resistor element. However as the collector node potential falls to the saturation threshold operating region, the base drive clamp circuit operates and the clamp circuit also flows into the collector of the phase splitter transistor element. Typically, the base drive clamp circuit current is approximately one third the collector path resistor current and for a TTL switching transistor element turn on time of 3 ns, the clamp current cuts in at 1.5 ns. The resulting graduated turn on of current from the emitter of the TTL phase splitter or other switching transistor element therefore inhibits ground bounce by reducing the parasitic voltage drop across the ground lead inductance.

A further feature and advantage of the overdrive and clamp circuit for high speed switching of the phase splitter transistor element is that ground undershoot at the output of the TTL output gate is suppressed. During transition from high to low potential at the TTL gate output, the emitter follower buffer transistor element driving the phase splitter transistor element, the phase splitter transistor element and the pulldown transistor element are all conducting. A current path is established between the reference voltage current source provided by the current mirror circuit and the output of the TTL gate through the internal Schottky diode clamp of the pulldown transistor element which is selected to be a Schottky transistor element. Upon occurrence of ground undershoot at the TTL gate output, that is a ground potential below external reference ground, a counteracting current is momentarily sourced from the reference voltage current source through the emitter follower transistor element, phase splitter transistor element, and Schottky diode clamp of the pulldown transistor element to the TTL gate output. The ground undershoot potential is therefore cancelled.

Thus, the overdrive circuit provides a counteracting current into the output exactly opposite to the parasitic ground undershoot inducing current. As soon as the potential at the output of the TTL gate passes below $V_{OL}$, the overdrive circuit and emitter follower transistor element pump the counteracting current into the output. The parasitic di/dt is "captured" by the counteracting -di/dt. As a result the parasitic ground undershoot potential Ldi/dt is cancelled by the counteracting potential -Ldi/dt. The emitter follower responds momentarily to the parasitic Ldi/dt across the output lead inductance as soon as it occurs.

Other objects, features and advantages of the invention are apparent in the following specification and accompanying drawings.

BRIEF DESCRIPTION OF THE DRAWINGS

FIG. 1A is a graph of the delayed ramp switching function during discharge and transition from logic high to low voltage level at the base of the phase splitter transistor element of FIG. 1.

FIG. 2A is a graph of the accelerated switching function during transition from logic high to low voltage levels at the base of the phase splitter transistor element of FIG. 2.

FIG. 3 is a fragmentary schematic circuit diagram of a portion of the translator circuit showing an alternative circuit configuration for the emitter follower output buffer circuit for limiting base drive to the phase splitter transistor element of the TTL gate.

DESCRIPTION OF PREFERRED EXAMPLE EMBODIMENTS AND BEST MODE OF THE INVENTION

Figure 1:
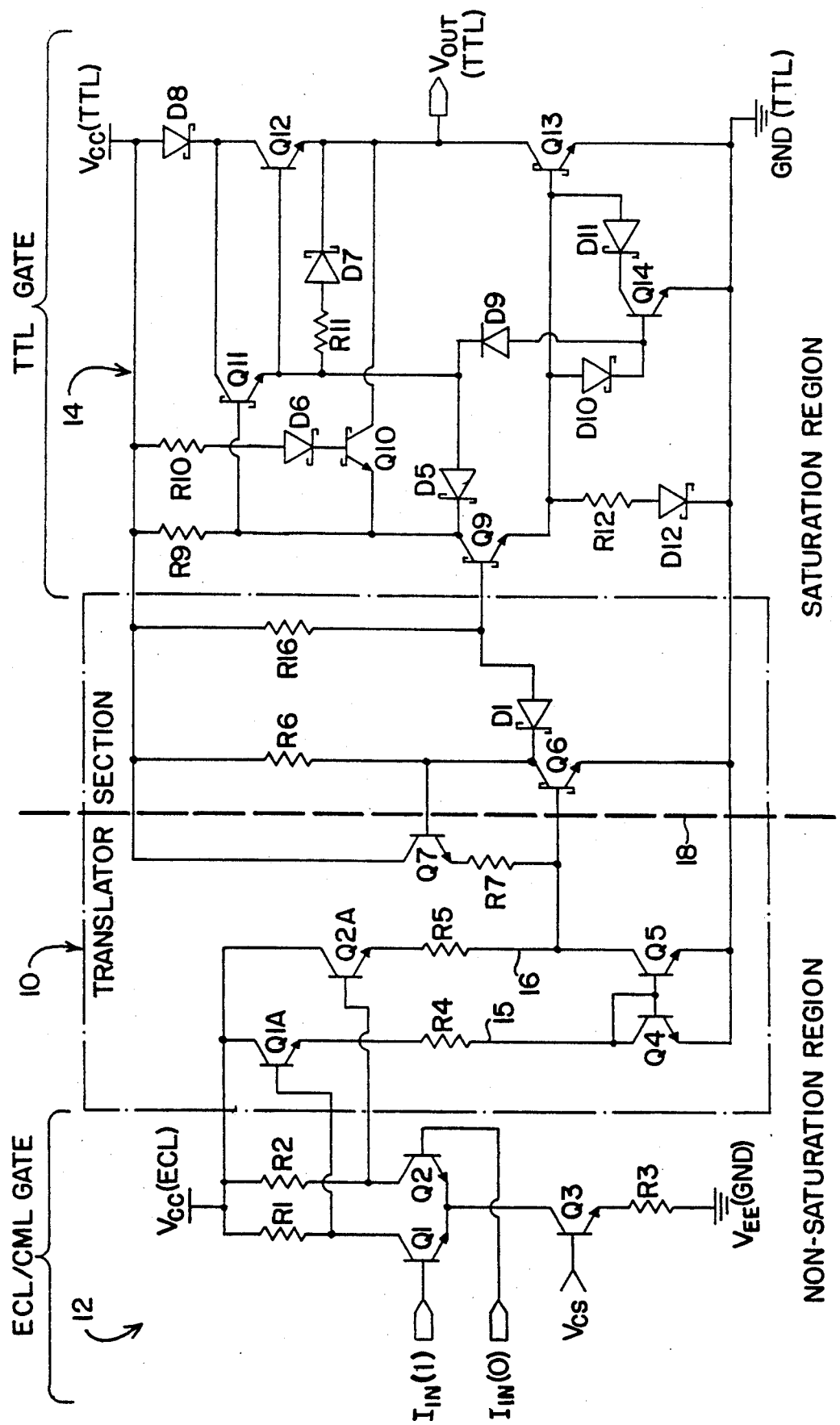
FIG. 1 is a schematic circuit diagram of a prior art ECL/CML to TTL translator circuit coupling the output of an ECL gate to the input of a TTL gate.
Figure 2:
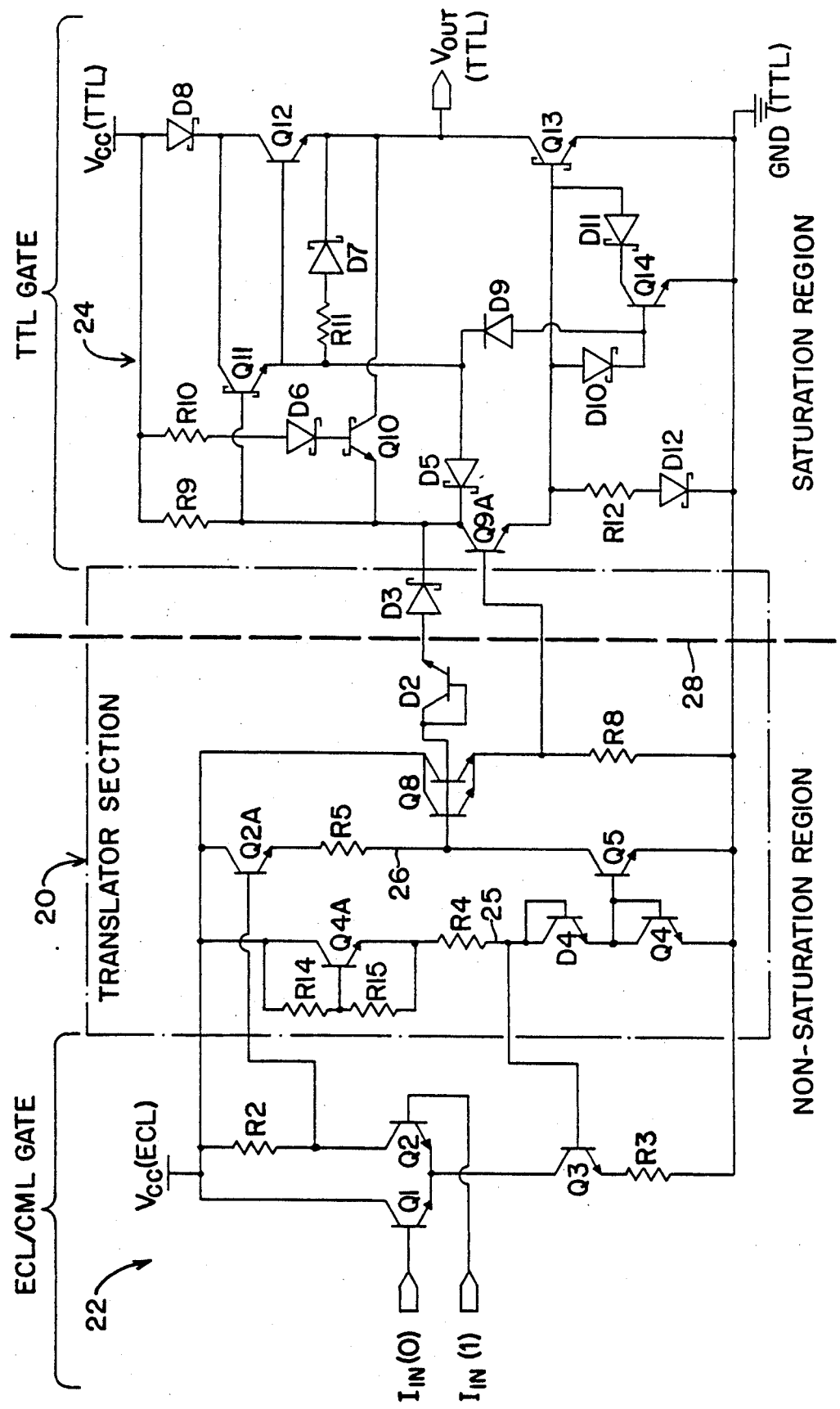
FIG. 2 is a schematic circuit diagram of an ECL/CML to TTL translator circuit coupling the output of an ECL gate to the input of a TTL gate according to the invention.

A translator circuit 20 according to the present invention is illustrated in FIG. 2 coupled between the conventional ECL gate 22 and TTL gate 24. Circuit components performing circuit functions comparable to the circuit components of FIG. 1 are indicated by the same reference designations. The first primary difference between the translator circuit 20 of FIG. 2 and the prior art translator circuit 10 of FIG. 1 is in the current mirror circuit provided by current mirror branch circuits 25 and 26 of FIG. 2. According to the invention, the current mirror branch circuit 25 is coupled between the higher voltage level ECL rail $V_{CC}$(ECL) and the lower voltage level or ground potential TTL rail GND (TTL) without any direct connection to the output of the ECL gate taken from the collector node of either of the ECL input transistors Q1 and Q2.

Resistor R4 in current mirror branch circuit 25 establishes a constant current or reference current in the branch circuit 25 according to the voltage drop across resistor R4. The voltage drop across resistor R4 is dependent upon the voltage level of the ECL voltage rail $V_{CC}$ and the respective voltage drops across resistor R14, $V_{BE}$ across transistor element Q4A and the two $V_{BE}$'s across the diode stack provided by base collector shorted (BCS) transistors D4 and Q4. Resistor R15 provides a bias resistor for transistor element Q4A. Transistor element Q4 provides the first current mirror transistor element in branch circuit 25. Transistor Q5 provides the second current mirror transistor element in the branch circuit 26 and is coupled in current mirror configuration with the first current mirror transistor element Q4.

The second current mirror branch circuit 26 is coupled to the output of the ECL gate at the collector node of ECL input transistor Q2 through emitter follower buffer transistor element Q2A and resistor R5. The second current mirror transistor element Q5 relays or mirrors the constant reference current from branch circuit 25 into the current mirror branch circuit 26. The constant reference current established in current mirror branch circuit 25 remains constant during switching of the ECL gate, maintaining the constant reference current between the higher level ECL reference voltage rail $V_{CC}$ and the lower level TTL reference voltage rail GND. This constant reference current is similarly mirrored and maintained in the second current mirror branch circuit 26 during switching of the ECL gate and as a result there is no switching of the second current mirror transistor element Q5.

The reference voltage level at the collector node of transistor element Q5 is shifted by resistor R5. The dependency of the voltage drop across resistor R5 on $V_{CC}$ is cancelled by the $V_{CC}$ dependency of the reference current mirrored in the second branch circuit 26. As a result of the offset and cancellation of the $V_{CC}$ dependencies in the second branch circuit 26, analysis shows that the voltage at the collector node of the second current mirror transistor element Q5 is referenced to the lower TTL voltage GND. This is accomplished however without switching of the current mirror transistor elements and without the resulting delay in signal propagation from the ECL gate to the TTL gate. The reference voltage level shifted output at the collector node of transistor Q5 switches between high and low voltage levels at a constant current during switching of the ECL gate input transistor Q2.

The reference voltage level shifted high and low logic voltage level output signals at the collector node of the second current mirror transistor element Q5 in the second current mirror branch circuit 26 are coupled to the base of an emitter follower output buffer circuit including emitter follower output buffer transistor element Q8 shown as a double transistor element. The emitter current from emitter follower output buffer transistor element Q8 drives the base of the phase splitter transistor element Q9A of TTL gate 24. Phase splitter transistor element Q9A is shown as a standard transistor element without internal Schottky clamping. Unlimited base drive from emitter follower transistor element Q8 could otherwise drive transistor Q9A into the deep saturation operating region. An external base drive clamp circuit is provided by diodes D2 and D3 coupled between the collector node of phase splitter transistor Q9A and the base node of emitter follower output buffer transistor element Q8. Diode D2 is a BCS transistor while diode D3 is a Schottky clamp diode providing in effect an external substitute for the internal Schottky diode clamping of phase splitter transistor element Q9 of FIG. 1.

With a logic low level signal at the TTL gate output $V_{OUT}$ and with phase splitter transistor element Q9A and pulldown transistor element Q13 conducting, the starting voltage level at the base of phase splitter transistor element Q9A is 2 $V_{BE}$ above the TTL ground GND. A logic high level signal at the translator circuit output at the collector node of the second current mirror transistor element Q5 maintains this condition with emitter follower output buffer transistor element Q8 conducting and supplying base drive current to the base of phase splitter transistor element Q9A.

Upon switching of the ECL gate and appearance of a logic low voltage level signal at the collector node of current mirror transistor element Q5, emitter follower output buffer transistor element Q8 temporarily turns off and is nonconducting. Discharge current from the base of phase splitter transistor element Q9A is discharged through pulldown resistor element R8 instead of through the second current mirror transistor element Q5. The resistor pulldown of the base of phase splitter transistor element Q9A provides accelerated discharge and accelerated decrease of the voltage level $V_B$Q9A as illustrated in the accelerated pulldown switching function of FIG. 2A. This accelerated discharge and turnoff of the phase splitter transistor element Q9A cannot be achieved by the current source transistor element discharge of the prior circuit of FIG. 1 in which the voltage transition follows the delayed ramp function of FIG. 1A as heretofore described.

Once the voltage at the base of phase splitter transistor element Q9A ($V_B$ Q9A) decreases from 2 $V_{BE}$ to approximately 1 $V_{BE}$, emitter follower output buffer transistor element Q8 can conduct at a reduced level through pulldown resistor R8. While phase splitter transistor element Q9A remains nonconducting, the emitter follower output buffer translator element Q8 is ready for rapid and accelerated turn on of the phase splitter transistor element upon transition from logic low to logic high voltage level at the collector node of current mirror transistor element Q5.

The temporary turn off of emitter follower transistor element Q8 and the resistive pulldown and discharge of the base of the phase splitter transistor element Q9A upon transition from logic high to logic low voltage level at the output of translator circuit 20 provided at the collector node of the second current mirror transistor element Q5 combine to provide an accelerated turn off of phase splitter transistor element Q9A not available in the prior art translator circuit. However this is followed by return of emitter follower transistor element Q8 to conduction at a reduced or subdued level ready for accelerated turn on.

Transition from logic low to logic high voltage level at the collector node of the second current mirror transistor element Q5 results in full conduction of emitter follower transistor element Q8 with initially unlimited emitter current for the base drive turning on the phase splitter transistor element Q9A. The initially unlimited base drive current provides overdrive for phase splitter transistor element Q9A for fast switching and accelerated turn on of the phase splitter transistor element. As soon as phase splitter transistor element Q9A becomes conducting however the drop in voltage at the collector node of the phase splitter transistor element Q9A is fed back through the base drive limiting clamp circuit provided by diodes D2 and D3 limiting the base drive of emitter follower transistor element Q8. This base drive limiting feedback clamp prevents phase splitter transistor element Q9A from operating in the deep saturation operating region and clamps operation of the phase splitter transistor element in the soft saturation or threshold saturation operating region, for example with a base to collector forward bias held in the range of 0.2 to 0.7 volts and preferably approximately 0.4 to 0.5 v.

The emitter follower output buffer circuit according to the invention therefore provides both accelerated turn off and accelerated turn on of the phase splitter transistor element of the TTL gate. These functions are performed solely by the components of the emitter follower output buffer circuit. Thus, the functions of operating control of the TTL gate input transistor element, in this example phase splitter transistor element Q9A, for operating in the saturation operating region are separated from the function of reference voltage level shifting. The circuit components of the current mirror branch circuits 25 and 26 perform a reference voltage level shifting function only. In particular, the second current mirror transistor element Q5 operates solely to perform the function of reference voltage level shifting across resistor R5 to provide the reference voltage level shifted output signal at the collector node of transistor Q5.

The function of operating region translating from the non-saturation operating region of the emitter coupled logic transistor elements to the saturation operating region of the TTL transistor elements is accomplished by the emitter follower output buffer circuit. Emitter follower transistor element Q8 itself operates in the linear non-saturation operating region. The emitter follower output buffer circuit includes the pulldown resistor element R8. In combination these components Q8 and R8 provide the accelerated turn on and accelerated turn off of the switching TTL input transistor element of the TTL gate 24, namely phase splitter transistor element Q9A. One or more additional TTL input stages may precede the phase splitter transistor element in which case the emitter follower buffer transistor element drives the TTL input transistor element. Preferably, the phase splitter transistor element is directly driven.

As a result logic high and low level signals can propagate through the translator circuit 20 from the ECL gate 22 to the TTL gate 24 without the delays interposed by the switching current mirror current source transistor elements of the prior art translator circuits. Nor are there the delays caused by circuit components performing dual functions of both reference voltage level shifting and operating region translating. By this arrangement the translator circuit of the present invention provides 30% overall improvement in speed in comparison with the translator circuit 10 of FIG. 1. Furthermore, the translator circuit 20 of FIG. 2 eliminates the additional inverting stage transistor element Q6, the first stage transistor element operating in the saturation region. As shown in FIG. 2 by the dash line 28, the emitter follower transistor element Q8 operating in the linear non-saturation region directly drives the phase splitter transistor element Q9A of TTL gate 24 in the soft saturation operating region or threshold of the saturation operating region. The translator circuit 20 of FIG. 2 also results in significant noise reduction in the $V_{CC}$ and ground GND power rails. As shown in FIG. 2 the power supply $V_{CC}$(ECL) and $V_{CC}$(TTL) can be coupled to the same $V_{CC}$ power rail while the low level voltage rails including $V_{EE}$ and ground GND (TTL) can be coupled to the same ground GND rail.

Another feature of the translator circuit 20 of FIG. 2 is the following. The diode stack provided by D4 and Q4 sets the tail current source voltage level $V_{CS}$ at, for example, 2 $V_{BE}$ above ground for driving the tail current source transistor element Q3.

An alternative embodiment of the emitter follower output buffer circuit of the translator section 20 is illustrated in FIG. 3. According to this embodiment the base drive from emitter follower transistor element Q8 to the base of phase splitter transistor element Q9B is limited by base drive limiting resistor R8A instead of the base drive limiting clamp circuit of FIG. 2 provided by diode elements D2 and D3. As shown in FIG. 3, the feedback clamp between the collector node of phase splitter transistor Q9B and the base node of emitter follower transistor element Q8 has been eliminated. Instead, base resistor R8A has been inserted at the base node of phase splitter transistor element Q9B. In this embodiment, the phase splitter transistor element Q9B is a Schottky transistor provided with an internal Schottky diode clamp between the collector and base nodes to maintain the phase splitter transistor element Q9B in the soft saturation operating region, preventing the transistor from being driven into the hard saturation operating region.

The remaining components of the emitter follower output buffer circuit remain the same as in FIG. 2 including the emitter follower transistor element Q8 and pulldown resistor element R8. The remainder of the translator circuit 20 and in particular the constant current non-switching current mirror circuit as set forth in FIG. 2 also remains the same. By the alternative circuit arrangement of FIG. 3 accelerated turn on of phase splitter transistor element Q9B is still achieved with limitation of the base drive by base resistor R8A and the internal Schottky clamp maintaining the phase splitter transistor element Q9B in the soft saturation operating region. Accelerated turn off of phase splitter transistor Q9B is achieved by the resistive pulldown through pulldown resistor element R8 as heretofore described. A typical value for the phase splitter base resistor R8A is, for example, 100 ohms.

Figure 4:
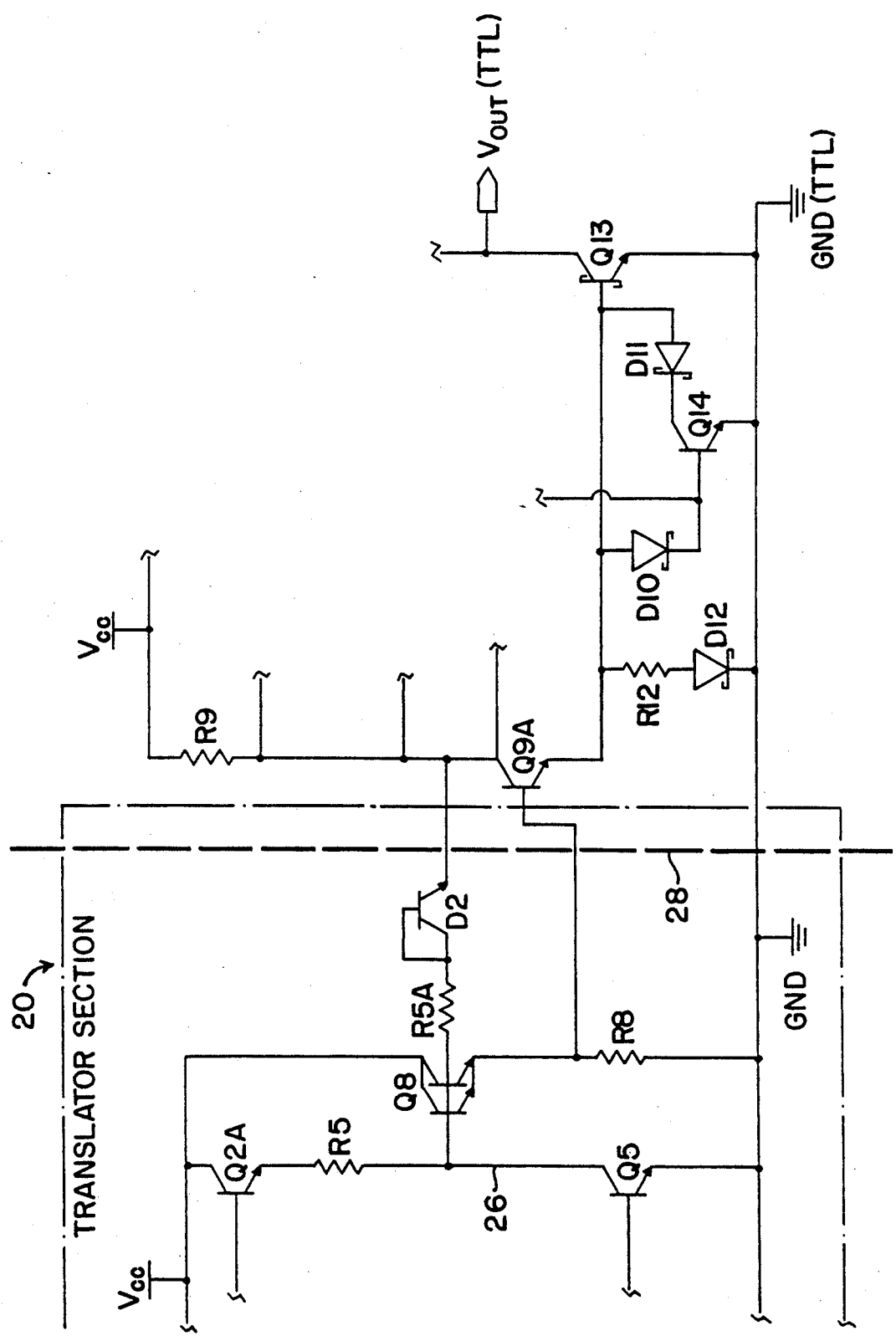
FIG. 4 is a fragmentary schematic circuit diagram showing a preferred base drive clamping circuit for the overdrive and clamp circuit coupled to the phase splitter transistor element or other switching TTL input transistor element.

A preferred arrangement for the base drive clamp circuit between the collector node of phase splitter transistor element Q9A and emitter follower output buffer transistor element Q8 is illustrated in the schematic circuit diagram excerpts of the ECL to TTL translator shown in FIG. 4. As shown in FIG. 4, the preferred base drive limiting clamp circuit is provided by resistor R5A and BCS diode D2. In this example the resistor R5A and diode D2 coupled between the collector node of phase splitter transistor Q9A and emitter follower transistor element Q8 replace the Baker clamp of FIG. 2 consisting of BCS diode D2 and Schottky diode D3. It is noted that the BCS diode D2 provides a diode potential drop of 1 $V_{be}$ which is also designated 1 $\phi$. The potential drop of 1 $V_{be}$ or 1 $\phi$ at room temperature is approximately 0.8 v. The resistance of resistor R5A is selected to provide a potential drop of approximately $\frac{1}{2}$ $V_{be}$ or 0.5 $\phi$.

The forward bias across the base to collector junction of the phase splitter transistor element Q9A provided by the base drive limiting clamp circuit components R5A and D2 when Q9A is conducting, is as follows. The potential drop of 1 $V_{be}$ across BCS diode D2 is cancelled or offset by the 1 $V_{be}$ potential drop across the base to emitter junction of emitter follower transistor Q8. As a result the forward bias across the base to collector junction of phase splitter transistor element Q9A when transistor element Q9A is conducting is approximately equal to the potential drop across resistor R5A, that is a potential drop of $\frac{1}{2}$ $V_{be}$ or 0.5 $\phi$. The operation of the phase splitter transistor element Q9A is therefore clamped in the so called soft saturation or threshold saturation operating region. For a standard TTL switching transistor element the soft saturation operating region or threshold of saturation operating region may be defined, for example as the base to collector forward biasing voltage range of approximately 0.2 to 0.7 volts and preferably according to the invention in the range of 0.4 to 0.5 volts.

More generally as shown in FIG. 4 the invention provides a new overdrive and anti-saturation clamp circuit for high speed switching operation of a phase splitter transistor element or other TTL input switching transistor element. The overdrive and anti-saturation clamp circuit includes a voltage reference current source provided by the current mirror circuit and in particular the current branch circuit 26. An emitter follower buffer transistor element Q8 delivers the current for driving the phase splitter transistor Q9A or other TTL input switching transistor element. The emitter follower buffer transistor element Q8 initially provides unlimited base drive or "overdrive" for fast turn on of the transistor element Q9A.

The overdrive and anti-saturation clamp circuit also includes the base drive limiting clamp circuit provided in the example of FIG. 4 by the resistor R5A and BCS diode junction element D2 coupled in series. The resistance value of resistor R5A is selected to provide the desired forward bias voltage across the base to collector junction of transistor element Q9A to clamp operation of the transistor element in the soft saturation operating region. This anti-saturation clamping action by the base drive limiting clamp circuit assures rapid turn off of transistor element Q9A during active switching.

An additional feature of the overdrive and anti-saturation clamp circuit is that the turn on of phase splitter transistor element Q9A or other TTL input switching transistor element is graduated. The collector to emitter current through transistor element Q9A upon transition from low to high potential at the base node of transistor element Q9A is initially provided by the collector path current through collector path resistor R9. This collector current is then enhanced for example after 1.5 ns by the base drive limiting clamp circuit current through resistor R5A and diode D2. The clamp circuit current may be in the order of $\frac{1}{3}$ the collector path current providing a graduated increase in the current sinking to the ground rail. As a result the change in current di/dt across the parasitic inductance L of the ground rail is reduced and the ground bounce potential L di/dt inhibited.

Furthermore in the context of the TTL output gate, phase splitter transistor element Q9A drives pulldown transistor element Q13. Upon transition from high to low potential at the TTL gate output $V_{out}$, transistor elements Q8, Q9A and Q13 are all conducting. A current path is therefore established between the voltage reference current source in current mirror branch circuit 26 and the TTL gate output $V_{out}$ through emitter follower transistor Q8, phase splitter transistor element Q9A, and the internal Schottky diode clamp of the Schottky transistor element Q13. Upon the occurrence of negative ground undershoot, emitter follower transistor element Q8 responds momentarily delivering a ground undershoot counteracting current. As a result parasitic ground undershoot current change -di/dt is cancelled or offset by the emitter follower sourced counteracting current change di/dt.

It is apparent that the overdrive and anti-saturation clamp circuit may have broad application for high speed switching and control of TTL switching transistor elements generally.

While the invention has been described with reference to particular example embodiments it is intended to cover all modifications and equivalents within the scope of the following claims.

What is claimed is:

1. An ECL/CML to TTL translator circuit for coupling the output of ECL/CML gate to the input of a TTL gate, said ECL/CML gate operating with reference to a specified reference voltage level and in the non-saturation operating region, comprising:

a reference voltage level shifting current mirror circuit means having a non-current switching constant current first branch circuit and a second branch circuit coupled in current mirror configuration with the first branch circuit, said second branch circuit being coupled to the output of the ECL/CML gate and being constructed for shifting the reference voltage level at the ECL/CML gate output and for delivering a reference voltage level shifted output signal at a second branch circuit output node;

and an operating region translating emitter follower output buffer circuit having an emitter follower transistor element coupled in emitter follower configuration with a base node coupled to the second branch circuit output node of the current mirror circuit means to receive the voltage level shifted output signal and drive the input of the TTL gate in the saturation operating region;

said circuit functions of reference voltage level shifting and of operating region translating being thereby separately performed by separate components respectively of said current mirror circuit means and said emitter follower output buffer circuit.

2. The translator circuit of claim 1 wherein the emitter follower output buffer circuit comprises resistor pulldown means coupled to the TTL gate input for resistive discharge of a transistor element of the TTL gate input.

3. An ECL/CML to TTL translator circuit for coupling the output of an ECL/CML gate to the input of a TTL gate, said ECL/CML gate operating with reference to a first power rail higher reference voltage level and said TTL gate operating with reference to a second power rail lower reference voltage level, said translator circuit comprising:
   a reference voltage level shifting constant current circuit comprising a first current mirror branch circuit and first current mirror transistor element operatively coupled between the higher reference voltage level and the lower reference voltage level for generating a constant reference current, a second current mirror branch circuit and second current mirror transistor element operatively coupled between the ECL/CML gate output and the lower reference voltage level, said second current mirror transistor element being coupled in current mirror configuration with the first current mirror transistor element for mirroring the constant reference current at the output of the ECL/CML gate, and level shifting resistance means in the second current mirror branch circuit for shifting the reference voltage level of an output signal from the ECL/CML gate output from the higher to the lower reference voltage level at a collector node of the second current mirror transistor element, said collector node providing a reference voltage level shifted output.

4. The translator circuit of claim 3 wherein the ECL/CML gate comprises transistor elements operating in the non-saturation operating region and wherein the TTL gate comprises transistor elements operating in the saturation operating region, and further comprising:
   an operating region translating circuit comprising an emitter follower output buffer circuit operating in the non-saturation operating region and operatively coupled to receive base drive from the reference voltage level shifted output and to drive the input of the TTL gate in the saturation operating region, thereby separating the circuit functions of reference voltage level shifting and of operating region translating into separate circuit components of the translator circuit.

5. The translator circuit of claim 4 wherein the emitter follower output buffer circuit comprises resistor pulldown means operatively coupled between the TTL gate input and the lower reference voltage level for discharging a transistor element of the TTL gate through the resistor pulldown means.

6. The translator circuit of claim 5 wherein the TTL gate comprises a phase splitter transistor element coupled to receive base drive from the emitter follower output buffer circuit, said resistor pulldown means being coupled between the base node of the phase splitter transistor element and the lower reference voltage level.

7. The translator circuit of claim 6 further comprising a base drive clamp circuit operatively coupled between the collector node of the phase splitter transistor element and the base node of the emitter follower output buffer circuit for clamping operation of the phase splitter transistor element in the soft or threshold saturation operating region.

8. The translator circuit of claim 7 wherein the base drive clamp circuit comprises a resistor and a $V_{be}$ diode junction coupled in series.

9. The translator circuit of claim 7 wherein the base drive clamp circuit comprises a Schottky diode junction and a $V_{be}$ diode junction in series.

10. The translator circuit of claim 4 wherein the TTL gate input comprises a TTL transistor element coupled to receive base drive from the emitter follower output buffer circuit, and further comprising a base drive clamp circuit coupled between a collector node of the TTL transistor element and a base node of the emitter follower output buffer circuit for clamping operation of the TTL transistor element in the soft or threshold saturation operating region.

11. The translating circuit of claim 10 wherein the base drive clamp circuit comprises a resistor and a $V_{be}$ diode junction coupled in series.

12. An ECL/CML to TTL translator circuit for coupling the output of an ECL/CML gate to the input of a TTL gate, said ECL/CML gate operating with reference to a first power rail higher reference voltage level with transistor elements operating in the non-saturation operating region of the operating characteristics of the ECL/CML gate transistor elements, said TTL gate operating with reference to a second power rail lower reference voltage level with transistor elements operating in the saturation operating region of the operating characteristics of the TTL gate transistor elements, said ECL/CML and TTL gates having respective inputs and outputs switching between high and low potential levels for transmitting data, said translator circuit comprising:
   a reference voltage level shifting current mirror circuit having a first constant current source branch circuit coupled between the higher and lower reference voltage levels without direct connection to the ECL/CML gate output, for generating a substantially constant reference current between the higher and lower reference voltage levels and maintaining said constant reference current during switching of the ECL/CML gate input and output, said first constant current source branch circuit comprising a first current mirror transistor element;
   said reference voltage level shifting current mirror circuit comprising a second constant current source branch circuit operatively coupled between the ECL/CML gate output and the lower reference voltage level, said second constant current source branch circuit comprising a second current mirror transistor element operatively coupled in current mirror configuration with the first current mirror transistor element for mirroring the substantially constant reference current in the second constant current source branch circuit and for maintaining said mirrored constant reference current during switching of the ECL/CML gate input and output;
   and level shifting resistance means coupled to the collector node of the second current mirror transistor element in the second constant current source branch circuit, for shifting the reference voltage level at the collector node of the second current mirror transistor element from the higher reference voltage level to the lower reference voltage level for providing a reference voltage level shifted output at said collector node.

13. The translator circuit of claim 12 further comprising:
an operating region translating circuit comprising an emitter follower transistor element output buffer circuit coupled to receive base drive from the collector node of the second current mirror transistor element and having an emitter node coupled to the TTL gate input for driving the input of the TTL gate in the saturation operating region.

14. The translator circuit of claim 13 wherein the TTL gate input is coupled to the lower reference voltage level through resistor pulldown means for discharging a transistor element of the TTL gate to said lower reference voltage level through the resistor pulldown means.

15. The translator circuit of claim 14 wherein the TTL gate input comprises a phase splitter transistor element coupled to receive base drive from an emitter node of the emitter follower transistor element output buffer circuit, said resistor pulldown means being coupled between the base node of the phase splitter transistor element and the lower reference voltage level.

16. The translator circuit of claim 15 further comprising a base drive limiting resistor element coupled between an emitter node of the emitter follower transistor element output buffer circuit and the phase splitter transistor element.

17. The translator circuit of claim 15 comprising a base drive clamp circuit coupled between a base node of the emitter follower transistor element output buffer circuit and the collector node of the TTL gate phase splitter transistor element for clamping operation of the phase splitter transistor element in the soft or threshold saturation operating region.

18. The ECL/CML to TTL translator circuit of claim 12 wherein the first constant current source branch circuit comprises a standard reference resistance means having resistance substantially equal to the reference voltage level shifting resistance means in the second constant current source branch circuit, and wherein a standard reference voltage drop across the standard reference resistance means is established by a diode stack from the lower reference voltage level.

19. The translator circuit of claim 18 wherein the diode stack comprises at least one base collector shorted (BCS) transistor element and wherein said BCS transistor element also comprises the first current mirror transistor element.

20. The translator circuit of claim 18 further comprising a tail current source for the ECL/CML gate and wherein the first constant current source branch circuit is coupled to drive the tail current source for the ECL/CML gate, said diode stack establishing a tail current source voltage $V_{CS}$.

21. In an ECL/CML to TTL translator circuit for coupling the output of an ECL/CML gate to the input of a TTL gate, said TTL gate input comprising a TTL input transistor element, said ECL/CML gate operating with reference to a first power rail higher reference voltage level with transistor elements operating in the non-saturation operating region of the operating characteristics of the ECL/CML gate transistor elements, said TTL gate operating with reference to a second power rail lower reference voltage level with transistor elements operating in the saturation operating region of the operating characteristics of the TTL gate transistor elements, said translator circuit including a reference voltage level shifting current mirror circuit having first and second current mirror branch circuits with respective first and second current mirror transistor elements operatively coupled in current mirror configuration with a level shifting resistor element in the second current mirror branch circuit, the collector node of the second current mirror transistor element providing a reference voltage level shifted output of the current mirror circuit, the improvement comprising:
an emitter follower transistor element output buffer operating in the non-saturation operating region and having a base node coupled to said second current mirror transistor element collector node, said emitter follower transistor element output buffer being coupled to the input of a TTL gate for driving a TTL gate transistor element in the saturation operating region, said emitter follower transistor element output buffer providing an operating region translating circuit thereby separating the functions of reference voltage level shifting and operating region translating in separate circuit components of the translating circuit, resistor pulldown means coupled between the TTL input transistor element and the lower reference voltage level for discharging the TTL input transistor element through the resistor pulldown means, and a base drive clamp circuit coupled between a collector node of the TTL input transistor element and the base node of the emitter follower transistor element output buffer to clamp the operation of the TTL input transistor element in the soft or threshold saturation operating region.

22. The transistor circuit of claim 21 wherein the base drive clamp circuit comprises a resistor and a $V_{be}$ diode junction coupled in series.

23. The translator circuit of claim 21 wherein the base drive clamp circuit comprises a Schottky diode junction and a $V_{be}$ diode junction coupled in series.

24. The translator circuit of claim 21 wherein the TTL input transistor element comprises a phase splitter transistor element.

* * * * *